United States Patent [19]

Kesselman et al.

[11] Patent Number: 4,486,518
[45] Date of Patent: Dec. 4, 1984

[54] DUPLICATING FILM MASK WITH RADIATION ABSORBING BENZOPHENONE IN PROCESSED POSITIVE-WORKING RADIATION SENSITIVE LAYER ON TRANSPARENT SUBSTRATE

[75] Inventors: Jerome Kesselman, Yonkers; James Shelnut, Mahopac; Alan Wilkes, Brewster, all of N.Y.

[73] Assignee: Polychrome Corporation, Yonkers, N.Y.

[21] Appl. No.: 420,766

[22] Filed: Sep. 21, 1982

Related U.S. Application Data

[63] Continuation of Ser. No. 236,400, Feb. 20, 1981, abandoned.

[51] Int. Cl.$^3$ ............................ G03F 1/00; G03C 3/00; G03C 1/78
[52] U.S. Cl. ............................................ 430/5; 430/13; 430/17; 430/18; 430/145; 430/165; 430/177; 430/179; 430/302; 430/326; 430/512; 101/470; 101/471; 101/473
[58] Field of Search ....................... 430/14, 17, 18, 24, 430/28, 145, 177, 179, 512, 5, 148, 13, 165, 302, 326; 101/456, 453, 470, 471, 473

[56] References Cited

U.S. PATENT DOCUMENTS

| | | | |
|---|---|---|---|
| 3,253,921 | 5/1966 | Sawdey | 430/512 |
| 3,525,618 | 8/1970 | Keller et al. | 430/177 |
| 3,661,582 | 5/1972 | Broyde | 430/191 |
| 3,661,591 | 5/1972 | Reed | 430/177 |
| 3,794,493 | 2/1974 | Sobel et al. | 430/512 |
| 4,115,128 | 9/1978 | Kita | 430/191 |
| 4,154,613 | 5/1979 | Doering | 430/24 |
| 4,164,421 | 8/1979 | Shinozaki et al. | 430/165 |
| 4,173,470 | 11/1979 | Fahrenholtz et al. | 430/5 |
| 4,191,573 | 3/1980 | Toyama et al. | 430/191 |
| 4,275,139 | 6/1981 | Stahlhofen | 430/191 |
| 4,297,428 | 10/1981 | Kobayashi | 430/191 |

FOREIGN PATENT DOCUMENTS

| | | | |
|---|---|---|---|
| 469194 | 11/1950 | Canada | 430/512 |
| 1204917 | 9/1970 | United Kingdom | 430/191 |
| 525912 | 12/1976 | U.S.S.R. | 430/512 |

*Primary Examiner*—Charles L. Bowers, Jr.

[57] ABSTRACT

A non-silver, positive-working, essentially alkali-insoluble, radiation-sensitive composition, which becomes alkali-soluble on exposure to radiation, comprising a non-silver, positive-acting, essentially alkali-insoluble radiation-sensitive component a radiation absorbing component and an essentially alkali-soluble polymeric binder. A radiation-sensitive element comprising a transparent substrate overcoated with said radiation-sensitive composition. A duplicating film comprising the said element prepared by exposing said composition through the substrate and then image-wise exposing said composition through a mask in front of the composition followed by treatment with an alkaline developer to remove those areas of the composition subjected to both exposures.

2 Claims, No Drawings

DUPLICATING FILM MASK WITH RADIATION ABSORBING BENZOPHENONE IN PROCESSED POSITIVE-WORKING RADIATION SENSITIVE LAYER ON TRANSPARENT SUBSTRATE

BACKGROUND OF THE INVENTION

This application is a continuation in part of Ser. No. 236,400 filed Feb. 20, 1981, now abandoned.

This invention relates to duplicating films useful as masks for the preparation of lithographic printing plates. More particularly it relates to novel non-silver containing, positive-working coatings, radiation-sensitive elements comprising said coatings and duplicating films prepared from said radiation-sensitive elements.

In the graphic arts field a lithographic printing plate is produced by imagewise-exposure of a presensitized plate, comprising a substrate overcoated with a positive- or negative-working radiation-sensitive composition, to radiation followed by development. The imagewise-exposure is effected by passing radiation through a mask, comprising a transparent film having thereon areas transparent or opaque to the impressed radiation, to the pressurized plates.

In the case of a negative plate that has been exposed to light through a negative transparency, the light-sensitive material, commonly a diazo compound, is caused to harden and thereby become insoluble in a developer or desensitizing solution applied to the plates after light exposure for the purpose of removing that part of the light-sensitive coating which, because it was protected from the light of the negative, was not light-hardened. The light-hardened surface of a negative plate will be the oleophilic surface compatible with the greasy ink and is called the "image area", the surface from which the non-hardened light-sensitive material has been removed by a desensitizer will be, or can be converted to, a hydrophilic surface having little affinity for the greasy ink and is called the "non-image" area.

A positive plate is generally one upon which the non-image area is the portion of the light-sensitive diazo compound exposed to light while the unexposed portion is either oleophilic or adapted to be converted by chemical reaction to a hardened oleophilic ink-receptive image area.

It is known to use duplicating masks comprising transparent substrates, a first surface of which was overcoated with silver containing compositions which were image-wise exposed to radiation and then developed whereby the coatings in the unexposed areas were removed permitting transmission of radiation while the exposed areas became opaque precluding transmission of radiation upon imagewise exposure of a presensitized plate through the mask.

While the masks prepared in this manner are of excellent quality they are very expensive due to the high cost of silver. Thus, there has been considerable research direct to producing duplicating films which are not based on silver content.

A non-silver containing element for production of masking films, as described in Japanese Pat. No. 76-69627, comprises a double layered coating on a transparent substrate, one layer of which in contact with the substrate comprises a component opaque to the radiation and the other layer overlaying said opaque layer comprises a radiation-sensitive component. After development there remains transparent areas of the original elements which were not exposed and from which the soluble photosensitive and opaque layers have been removed and the exposed areas comprising substrate coated with the opaque layer and overcoated with the transparent, light-hardened layer. However, these coatings are generally thick whereby the resolution of the resultant film is decreased. Japanese Pat. No. 76-135691 describes another non-silver containing element comprising a double layered coating wherein the radiation-opaque layer comprises a vacuum deposited metal which must be etched in order to permit, after exposure and development of the exposed radiation-sensitive layer, passage of radiation during exposure of the presensitized lithographic plate. These elements require long exposure times and the etching process releases metal ions which create disposal problems. In the process described in U.S. Pat. No. 4,149,888 the photosensitive element comprises a transparent radiation-sensitive element and an ammonia activated coupling agent. According to that invention the element is imagewise exposed and developed after which the transparent image is rendered opaque by exposure to ammonia fumes whereby the unexposed transparent radiation-sensitive component is caused to couple with the coupling agent to form a radiation-opaque product. That process, and therefore the photosensitive element, has the advantage of handling and disposal of noxious fumes. Yet another non-silver containing element is the peel apart system described in Japanese Pat. No. 79-104,902 which is based on a decrease in adhesive strength at photosensitive component-substrate interfaces upon imagewise exposure to radiation. Those systems have the disadvantage of poor resolution.

The present invention overcomes the disadvantage of the above non-silver containing elements while providing masks of similar quality to the more expensive silver-containing masks, radiation-sensitive elements for use in their preparation and a composition useful in producing such elements.

SUMMARY OF THE INVENTION

The instant invention provides a low cost substitute for silver-containing compositions which may be used in the preparation of radiation-sensitive elements convertible into duplicating masks for the production of lithographic printing plates.

In accordance with this invention there is provided a non-silver containing positive-working, radiation-sensitive essentially alkali-insoluble composition comprising:
  (a) at least one positive-working, radiation-sensitive, essentially alkali-insoluble component;
  (b) at least one radiation-absorbing component; and
  (c) at least one alkali-soluble polymeric binder; said composition being rendered alkali-soluble upon exposure to said radiation.

Additionally, if desired, the radiation-sensitive composition may contain one or more additives selected from the group consisting of thermal polymerization inhibitors, scratch resistant polymers, dyes to indicate contrast and/or print-out, radiation sensitivity enhancers, and print-out enhancers.

Positive-acting radiation-sensitive components include the diazo oxides such as the water-insoluble esters and amides of naphthoquinone diazide sulfonic or carboxylic acids as described, e.g., in U.S. Pat. No. 3,969,118 and *Light Sensitive Systems* by J. Kosar (John Wiley & Sons, Inc., N.Y. 1965, pp 336ff); acrylic polymers (such as polymethacrylates and polyacrylates), and the like, and mixtures thereof.

Preferred positive-acting, water-insoluble, radiation-sensitive components comprise esters formed by the reaction of diazo-1,2-naphthoquinone sulfonyl halides, wherein the diazo group is in the 1- or 2-position and the halide is in the 4- or 5-position, with condensation polymers formed by reaction of mono- or polyhydroxyaryl compounds with ketones or aldehydes.

The above hydroxyaryl compounds include phenol, naphthol, resorcinol, phloroglucinol, pyrogallol, and the like, and mixtures thereof.

A most preferred positive-acting, radiation-sensitive component comprises the ester formed by reaction of 2-diazo-1,2-naphthoquinone-5-sulfonyl chloride with a polymer formed by condensation of a cresol with formaldehyde (such as, Alnoval PN430 manufactured by American Hoechst Corp.).

The radiation absorbing components which may be used according to this invention include triazines, triazoles, diarylketones, and the like, and mixtures thereof.

The triazoles which may be used according to the invention include benzotriazoles of the Formula I.

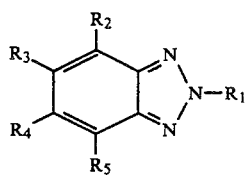

wherein $R_1$ is an aryl group which is substituted with at least one hydroxy, alkoxy, aryloxy, aralkoxy, sulfonic acid or ester, carboxylic acid or ester group wherein said alkoxy, aryloxy and aralkoxy groups may be further substituted with at least one group selected from hydroxy, halo, nitro, substituted- or unsubstituted-amino and which aryl group may be further substituted with one or more groups selected from alkyl, aryl, aralkyl which may be unsubstituted or substituted with at least one group selected from hydroxy, halo, nitro, substituted or unsubstituted amino;

$R_2$, $R_3$, $R_4$, and $R_5$ are the same or different and are selected from the group comprising hydrogen, alkyl, aryl, aralkyl, alkoxy, aralkoxy, aryloxy, nitro, halo, substituted amino wherein said alkyl, aryl, aralkyl, alkoxy, aralkoxy and aryloxy groups may be substituted or unsubstituted;

or $R_2$ and $R_3$, $R_3$ and $R_4$ and/or $R_4$ and $R_5$ together form alkylene, alkenylene or fused ring structures.

The diarylketones of the invention are compounds of the Formula II

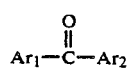

wherein $Ar_1$ and $Ar_2$ may be the same or different and are selected from the group consisting of $R_1$, as defined above,

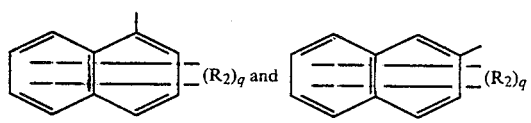

wherein the $R_2$'s are as defined above and 2 or more $R_2$'s may form an alkylene, alkenylene or fused ring structure, and q is an integer from 1 to 7.

Preferably the radiation absorbing component is selected from the group consisting of Michler's ketone, or a compound of Formula I, wherein $R_2$, $R_3$, $R_4$ and $R_5$ are each hydrogen and $R_1$ is

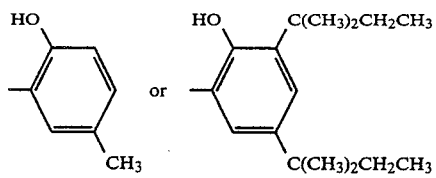

and mixtures thereof.

Most preferably the radiation absorbing component is a compound of the Formula I wherein $R_1$, $R_2$, $R_3$, $R_4$, and $R_5$ are defined above or mixtures thereof.

The polymeric binders which may be used in preparing the composition of the invention include the alkali-soluble products of the condensation of mono- or polyhydroxyaryl compounds with ketones or aldehydes as described above.

In accordance with this invention there is also provided a non-silver containing, positive-working, radiation-sensitive element useful in the preparation of duplicating films which comprises a substrate, transparent to the applied radiation, said substrate being coated on one surface thereof with the above positive-working, radiation-sensitive composition.

The substrates which may be used in accordance with the instant invention are polyesters, exemplified by poly(ethylene terephthalate) (e.g., Mylar ™ manufactured by DuPont); polycarbonates, (e.g., Lexan ™ manufactured by General Electric Co.), glass plates; quartz plates; polyolefins (such as, poly(methylpentene) and transparent polypropylene); transparent polyamides, (e.g., nylons, such as Trogamid ™ manufactured by Dynamit Nobel) transparent silicones, and the like.

In practice the coating may be applied to the substrate by methods known to the art including spray coating, dip coating, electrostatic coating, melt coating, roller coating, reverse roller coating and the like.

If necessary, the coating composition may first be dissolved in a solvent therefor and after coating the substrate the solvent may be removed by methods known to the art.

Solvents for use in preparation of the coating solutions may be exemplified by polar organic solvents, halogenated alkanes, alcohols, ketones, ethers, and the like, and mixtures thereof.

Illustrative of the polar organic compounds are dimethylformamide (DMF), dimethylacetamide, dimethylsulfoxide, acetonitrile, 1-methyl-2-pyrrolidone, and the like, and mixtures thereof.

The halogenated alkanes may be illustrated by methylene chloride, ethylene dichloride, perchlorethylene, and the like, and mixtures thereof.

Examples of alcohols useful in accordance with this invention are methanol, ethanol, isopropanol, amyl alcohols, and the like and mixtures thereof.

The ketones useful in accordance with this invention may be illustrated by methyl ethyl ketone (MEK), methyl isobutyl ketone, and the like, and mixtures thereof.

The ethers include 2-methoxyethanol, e.g., Methyl Cellosolve TM and the like, and mixtures thereof.

A preferred solvent comprises a mixture of 10 to 20% DMF, 20 to 50% methylene chloride, 0 to 15% methanol and 20 to 50% Methyl Cellosolve.

A most preferred solvent is a mixture comprising 11.9% MEK, 11.9% DMF, 33.3% Methyl Cellosolve, 33.3% methylene chloride and 9.5% methanol.

There is further provided, in accordance with this invention a duplicating film prepared by, I. exposing the above radiation-sensitive element to radiation through the transparent substrate whereby a portion of the radiation-sensitive composition adjacent to the substrate interacts with the radiation and is rendered alakali-soluble.

II. then image-wise exposing said element through a mask in front of or in contact with the other face of the composition whereby the exposed area is rendered alkali-soluble, and III. then developing said element with an alkaline developer to remove those areas of the composition which were exposed through both the transparent substrate and the mask while the areas not image-wise exposed, through the mask, provide opaque areas for preparing printing plates.

The portion of the radiation-sensitive composition which is rendered alkali-soluble, in the first step, is a volume element whose dimensions are the surface area of the substrate face and the depth of penetration of the radiation into the composition. The depth of penetration is a function of the concentration of radiation-absorbing component in the composition. Thus, as the concentration increases the thickness of the coating may be decreased and as the concentration decreases it is necessary to increase the coating thickness.

In one embodiment the radiation-sensitive composition comprises about 10 to about 40% w/w radiation-sensitive component, about 4 to about 10% w/w radiation absorbing component and about 30 to about 85% w/w alkali-soluble polymeric binder, all percentages being based on total composition weight.

More preferably, the radiation-sensitive composition comprises about 15 to about 35% w/w radiation-sensitive component, about 5 to about 10% w/w radiation-absorbing component and about 40 to about 60% w/w polymeric binder, all percentages being based on the total weight of the composition.

The radiation-sensitive composition may also contain about 1.0 to about 2.0% w/w thermal polymerization inhibitors, about 0.5 to about 10.0% w/w scratch resistant polymers, about 1.0 to about 5.0% w/w radiation sensitivity enhancers, about 1.0 to about 10.0% w/w dyes to indicate print-out and/or contrast and about 1.0 to about 5.0% w/w of compounds to aid in print-out, percentages based on total solids content.

The duplicating films may be prepared by exposure of the radiation-sensitive elements to various types of radiation, as known in the art, including UV, visible light, IR, electron beam and lasers.

The exposed elements may be developed by treatment with alkaline developers, as known in the art, including aqueous sodium silicate and phosphates.

The following examples illustrate but do not limit the invention which may be varied and modified without departing from the spirit of the invention as claimed.

EXAMPLE 1

A mixture comprising,

| | |
|---|---|
| a phenol-formaldehyde resin | 8.4 g |
| 2-diazo-1,2-naphthoquinone-4-sulfonylchloride | 1.475 g |
| the reaction product of a cresol-formaldehyde resin and 2-diazo-1,2-naphthoquinone-5-sulfonyl chloride | 4.425 g |
| Tinuvin TM P | 0.437 g |
| Tinuvin TM 328 | 0.437 g |
| and Orasil TM Red B | 3.500 g | was dissolved in a 105 ml of a solvent comprising 11.9% MEK, 11.9% DMF, 33.3% Methyl Cellosolve, 33.3% methylene chloride and 9.5% methanol, all of the solvent percentages being in parts by volume based on total volume.

The above solution was applied by meniscus coating to a sheet of Mylar and dried. The resulting element was I. exposed in a Berkey Ascor 5 KW exposure to an Addalux 140604 diazo bulb through the transparent substrate for about 18 seconds and then through a mask in front of the composition for about 15 seconds followed by, II. development with an about 5% w/w aqueous sodium silicate composition to yield to mask which would prevent undesirable transmission of the radiation through the opaque areas up to exposures, in the above unit, for about 4 minutes and above, and can be used repeatedly without detrimental effects to the opacity of the mask.

EXAMPLE 2

A mixture comprising,

| | |
|---|---|
| a phenol-formaldehyde resin | 10.58 g |
| 2-diazo-1,2-naphthoquinone-5-sulfonic acid alkyl ester | 3.97 g |
| the product of the reaction of 2-diazo-1,2-naphthoquinone-5-sulfonyl chloride with the product of the reaction of pyrogallol with acetone | 3.97 g |
| Orasil TM Red B | 4.41 g |
| contrast enhancer | 0.37 g |
| Tinuvin P | 0.39 g |
| and Tinuvin 328 | 0.39 g | was dissolved in 105 ml. of the solvent of Example 1.

The above composition was used as indicated in Example 1 and similar results were obtained.

The preferred radiation components are those illustrated above and described in detail below:

Tinuvin P is a substituted hydroxyphenyl benzotriazole. It is a resonance hybrid of the following limiting structure:

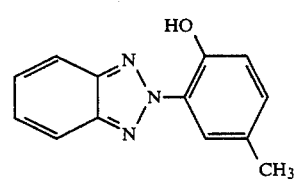

2(2'-hydroxy-5'-methyl phenyl) benzotriazole

Tinuvin 328 is one of a family of substituted benzotriazoles having the general structure:

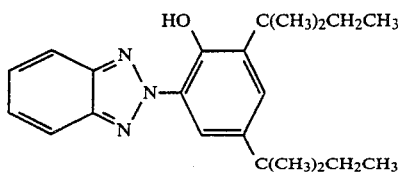

Both of these compounds are described in U.S. Pat. No. 3,004,896.

It will be apparent that many variations and modifications may be made in the compositions and procedures set forth above without departing from the broader aspects of the present invention.

What is claimed is:

1. A negative or positive duplicating film, useful as a mask in the preparation of lithographic printing plates, wherein the duplicating film to be processed comprises a first layer comprising a non-silver containing positive working, radiation-sensitive, essentially alkali-insoluble composition comprising:

(i) from about 10 to 40% by weight of at least one positive-working, radiation-sensitive, essentially alkali-insoluble component, (ii) from about 4 to 10% by weight of at least one radiation absorbing component selected from the group consisting of

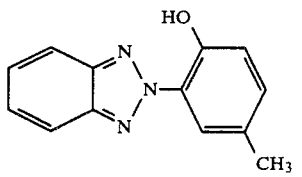

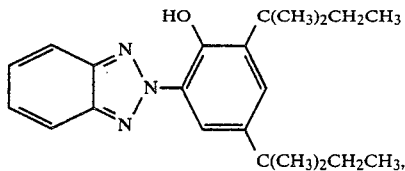

(iii) from about 30 to 85% by weight of (ii) at least one alkali-soluble binder, a surface of said first layer forming an interface with a second layer which comprises a substrate transparent to radiation; said duplicating film being prepared by treating said first layer utilizing the following steps:

(a) first exposed to radiation through the transparent substrate whereby a volume element of the composition, to a predetermined distance from the composition first substrate interface, is rendered alkali-soluble, (b) then imagewise exposed to radiation through a mask in front of, or in contact with the second surface of the first layer whereby the thus exposed areas are rendered alkali-soluble, and (c) treated with an alkali developer to remove the imagewise exposed areas of the radiation-sensitive composition which were exposed through both the transparent substrate and the mask, while the areas not exposed provide opaque areas.

2. The duplicating film of claim 1 wherein the radiation sensitive composition also contains a dye for indicating contrast and/or print out.

* * * * *